(12) United States Patent
Shin et al.

(10) Patent No.: US 7,726,301 B2
(45) Date of Patent: *Jun. 1, 2010

(54) SOLAR ENERGY BASE-BODY STRUCTURE

(75) Inventors: Hwa-Yuh Shin, Taoyuan (TW); Hwen-Fen Hong, Taoyuan (TW); Chieh Cheng, Taoyuan (TW); Hung-Sheng Chiu, Taoyuan (TW); Chih-Hung Wu, Taoyuan (TW); Yen-Cheng Tzeng, Taoyuan (TW)

(73) Assignee: Atomic Energy Council, Taoyuan (TW)

( * ) Notice: Subject to any disclaimer, the term of this patent is extended or adjusted under 35 U.S.C. 154(b) by 843 days.

This patent is subject to a terminal disclaimer.

(21) Appl. No.: 11/432,621

(22) Filed: May 12, 2006

(65) Prior Publication Data

US 2006/0215396 A1    Sep. 28, 2006

(51) Int. Cl.
*E06B 3/32* (2006.01)

(52) U.S. Cl. ............... 126/704; 312/265.1; 52/173.3; 52/200; 52/653.1; 211/182; 211/189; 211/198; 49/501

(58) Field of Classification Search ............. 126/794; 49/501; 211/182, 189, 198; 52/173.3, 200, 52/653.1

See application file for complete search history.

(56) References Cited

U.S. PATENT DOCUMENTS

| | | | | | |
|---|---|---|---|---|---|
| 3,784,043 | A | * | 1/1974 | Presnick | 220/4.28 |
| 4,205,486 | A | * | 6/1980 | Guarnacci | 49/501 |
| 4,899,507 | A | * | 2/1990 | Mairlot | 52/222 |
| 5,221,363 | A | * | 6/1993 | Gillard | 136/248 |
| 5,623,783 | A | * | 4/1997 | Kenkel | 49/21 |
| 6,067,760 | A | * | 5/2000 | Nowell | 52/204.57 |
| 6,123,400 | A | * | 9/2000 | Nicolai et al. | 312/265.1 |
| 2004/0111974 | A1 | * | 6/2004 | Boroviak | 49/501 |

* cited by examiner

*Primary Examiner*—Steven B McAllister
*Assistant Examiner*—Nikhil Mashruwala
(74) *Attorney, Agent, or Firm*—Jackson IPG PLLC

(57) ABSTRACT

A base body comprises two frames to put lens and solar cells. The working process is simple and the weight and the cost of the base body is reduced.

12 Claims, 9 Drawing Sheets

SOLAR ENERGY BASE-BODY STRUCTURE

FIELD OF THE INVENTION

The present invention relates to a base-body structure; more particularly, relates to fast assembling a base body with simple process and reduced weight and cost.

DESCRIPTION OF THE RELATED ART

A concentration-type solar power generation apparatus 7, as shown in FIG. 5, comprises a carrying frame 71 and at lease one light-collecting unit 72 deposed on the carrying frame 71. The carrying frame 71 comprises a plurality of rod components 711; at least one sliding trough 712 is located on a side surface of the rod component 711; and, the rod component 711 comprises at least one hollow portion 713 to reduce weight. The light-collecting unit 72 comprises a Fresnel lens 721 and a solar cell module 722; the solar cell module 722 is deposed on the carrying frame 71 with a plate component 723; the Fresnel lens 721 is deposed on the carrying frame 71 with a frame set 724; the frame set 724 has a side wing 725 to insert in the sliding trough 712 of the corresponding rod component 71; and, the carrying frame 71 has an upper frame 714 to carry the Fresnel lens 721 and a lower frame 715 to carry the solar cell module 722. As further shown in FIG. 6, the carrying frame 71 is assembled with an angle component 73, a female screw 74 and a screw plug 75, where the angle component 73 has a plurality of borings 731 and is adhered to two vertically connected rod components 711; the female screw 74 is set in the sliding trough 712 of the rod component 711; the screw plug 75 is fixed to the female screw 74 through the boring 731 of the angle component 73; the female screw 74 is fixed to the sliding trough 712 coordinated with a washer component 76. Or, as further shown in FIG. 7, the carrying frame 71 is assembled with a fixing hole 8, a female screw 82 and a screw plug 83, where the fixing hole 8 is set in the sliding trough 712 of the rod component 711; the female screw is set in the sliding trough 712 of the vertically adjacent rod component 711; and the screw plug 83 is fixed to the female screw 82 through the boring 81 of the fixing hole 8. Thus, a concentration-type solar power generation apparatus 7 is formed.

Although the above components formed a concentration-type solar power generation apparatus 7, its carrying frame 71 uses an angle component 73, a female screw 74, a screw plug 75 and a washer component 76, or a fixing hole 8, a female screw 82 and a screw plug, to fix the rod components 711 for assembling a carrying frame 71 so that the working process for assembling the carrying frame 71 becomes complex; the cost is increased and the assembling efficiency is reduced; and the carrying frame 71 obtained is heavier after adding these fixing components. Hence, the prior art does not fulfill users' requests on actual use.

SUMMARY OF THE INVENTION

The main purpose is to form a first frame and a second frame by using a plurality of rod bodies coordinated with a plurality of connection units to obtain a base-body structure fixed with a plurality of support units, where the working process is simplified and weight and cost are reduced.

To achieve the above purpose, the present invention is a solar energy base-body structure, comprising a plurality of rod bodies, a plurality of connection units and a plurality of support units, where the rod body has a gap portion at a side edge; a plurality of long troughs are located on a surface at another side and an adjacent side surface of the rod body; the rod body has a hollow portion penetrated through the middle of the rod body; the plurality of connection units are set in the hollow portions of the rod bodies to connect the rod bodies to form a first frame and a second frame; the support unit comprises two side plates; the side plate is fixed to the first frame and the second frame in between with fixing members fixed in the long troughs of the rod bodies to fix the support unit at a place two adjacent rod bodies are connected. Accordingly, a novel solar energy base-body structure is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is a perspective view showing the preferred embodiment according to the present invention;

DESCRIPTION OF THE PREFERRED EMBODIMENT

The following description of the preferred embodiment is provided to understand the features and the structures of the present invention.

Figure 1:
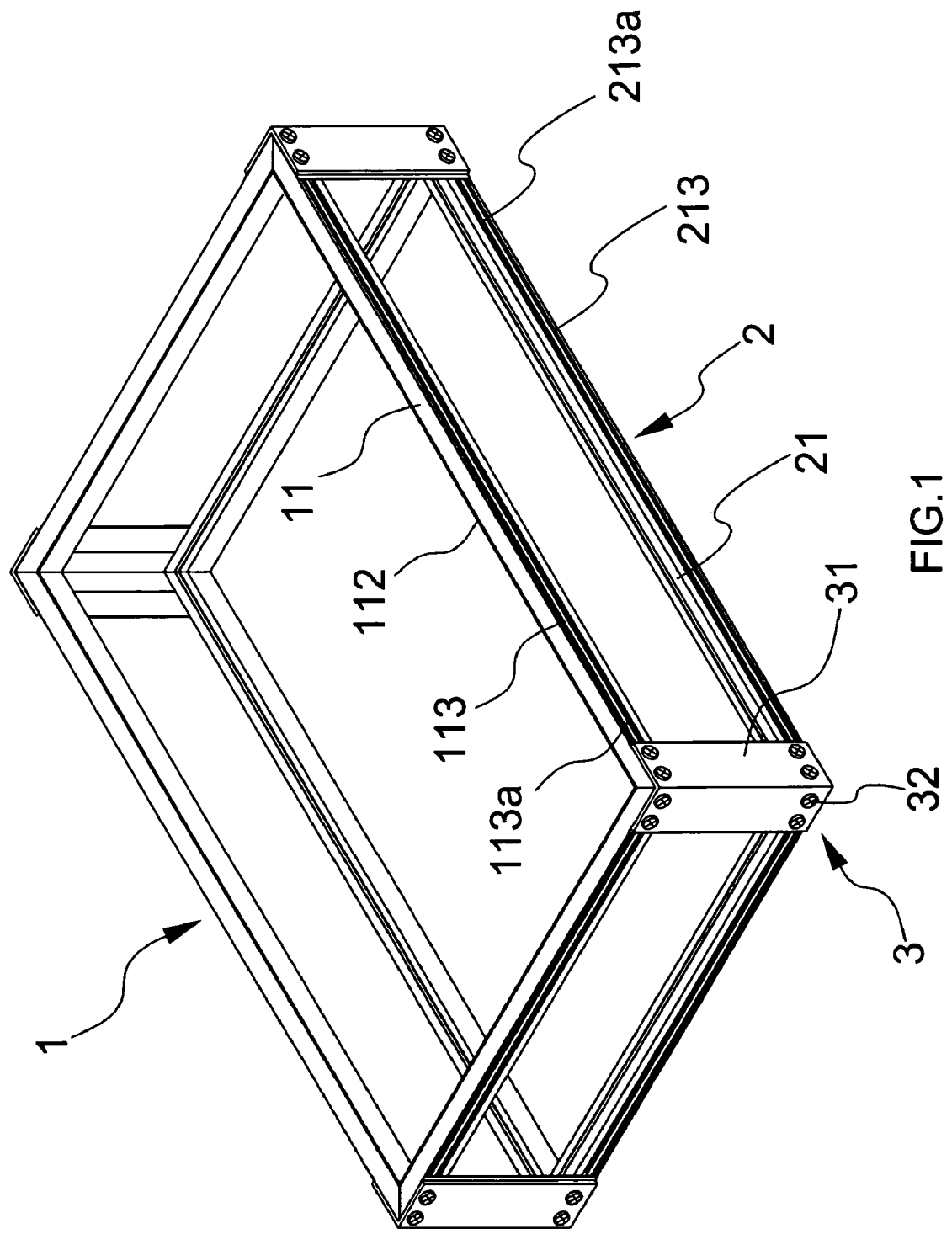
Figure 2A:
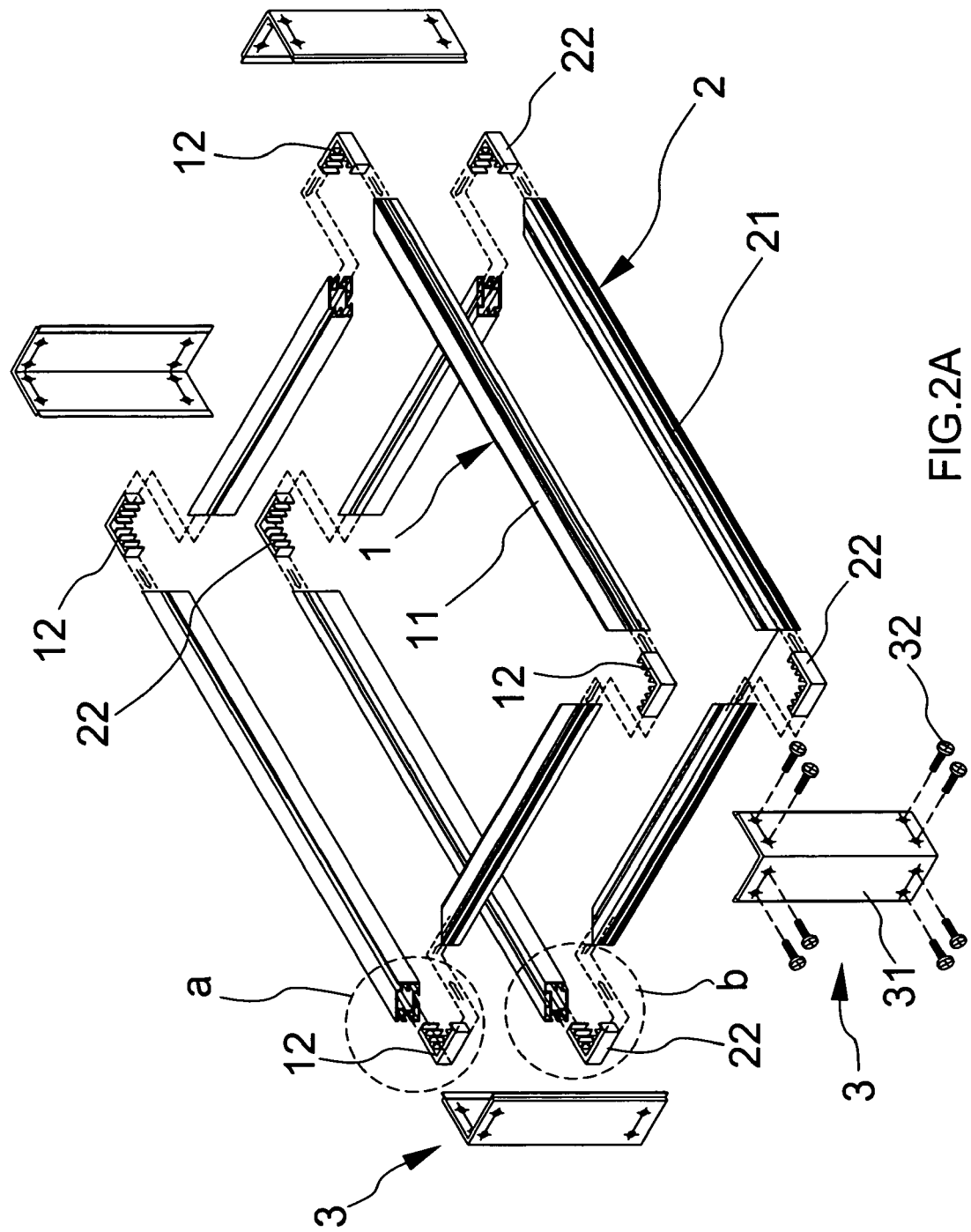
FIG. 2A is an explosive view showing the preferred embodiment.
Figure 2B:
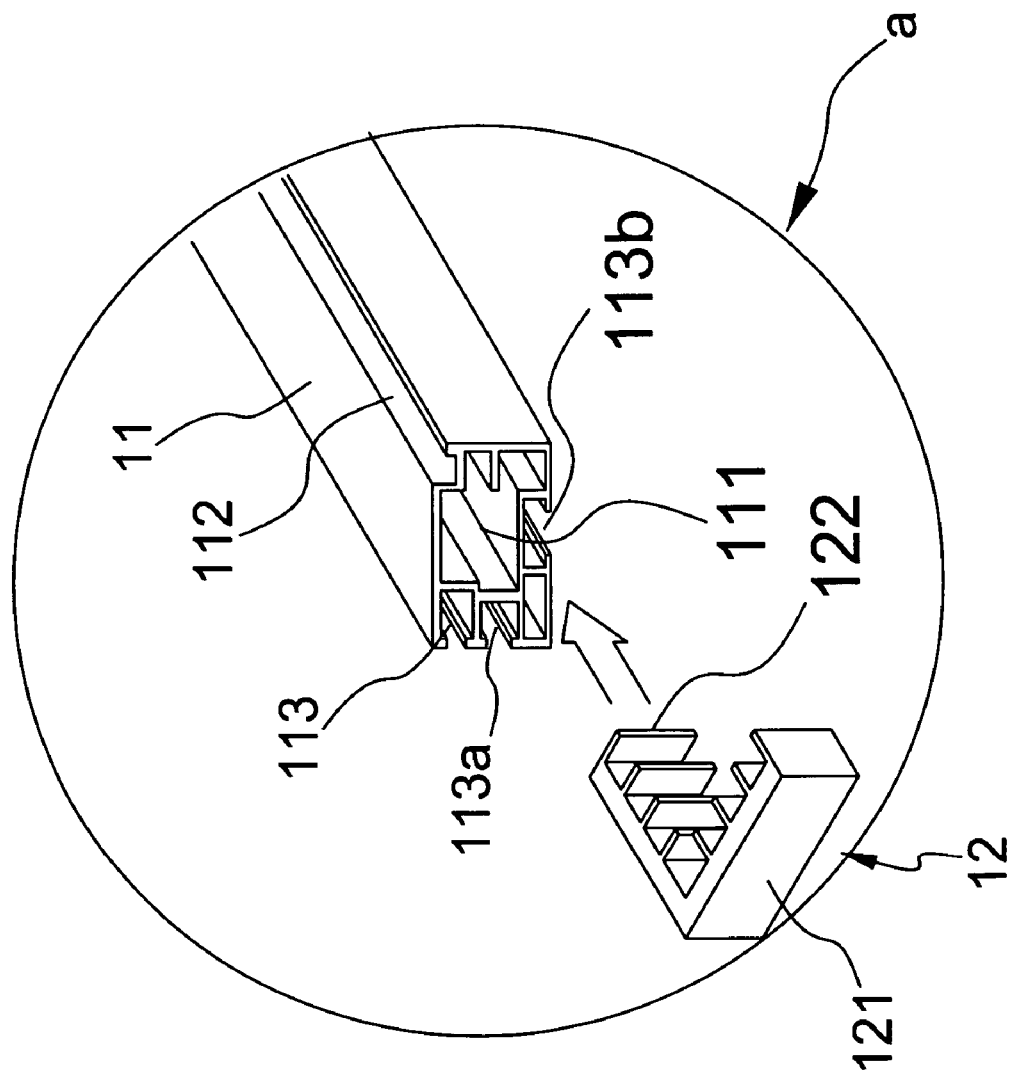
FIG. 2B is an enlargement view of A in FIG. 2A.
Figure 2C:
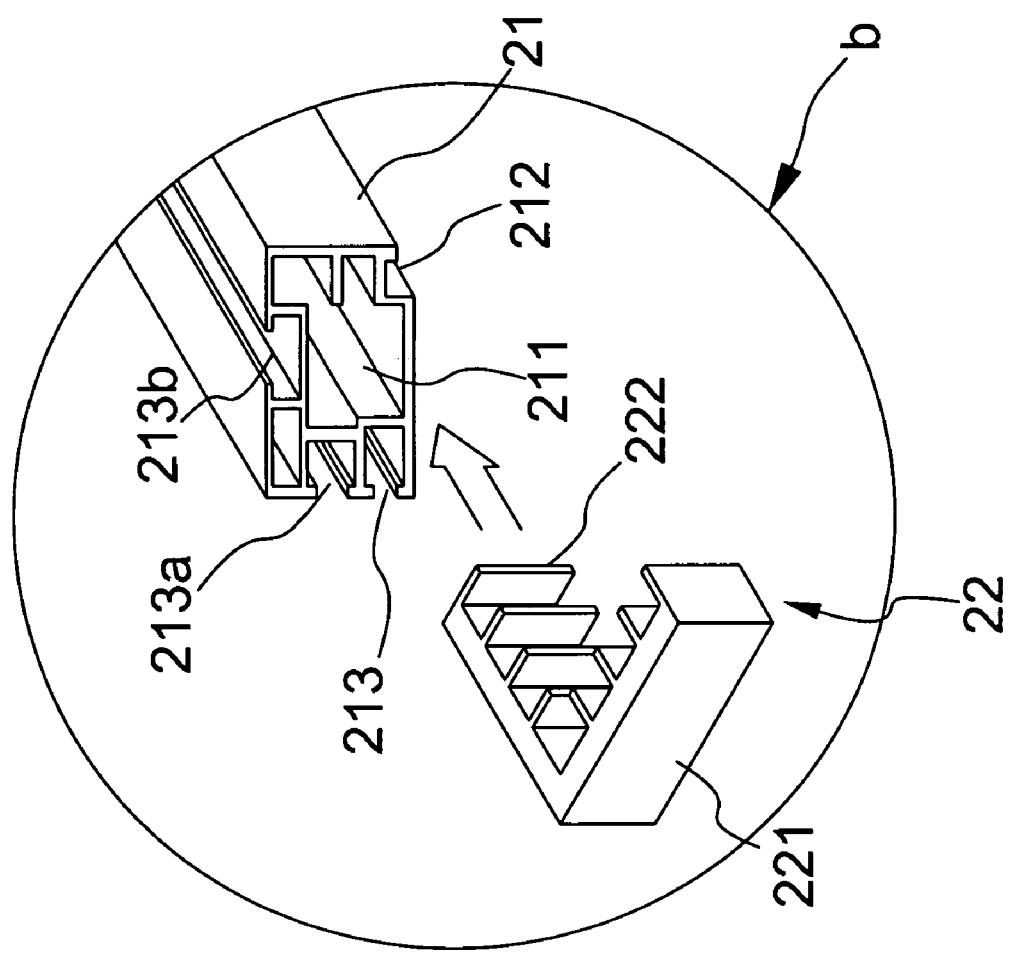
FIG. 2C is an enlargement view of B in FIG. 2A.

Please refer to FIG. 1, FIG. 2A, FIG. 2B and FIG. 2C, which are a perspective view showing the preferred embodiment according to the present invention, an explosive view showing the preferred embodiment and enlargement views of A and B in FIG. 2A. As shown in the figures, the present invention is a solar energy base-body structure, comprising a first frame 1, a second frame 2 and a plurality of support units, where the working process is simplified for fast assembling and cost and weight are reduced.

The first frame 1 comprises a plurality of rod body 11 with a hollow portion 111, and a connection unit 12 in the hollow portions 111 of two adjacent rod bodies 11, where the connection unit 12 has an 'L' shape and comprises two insertion portions 121 which are connected at a side and are inserted into the hollow portions 111 of the rod bodies 11; each of the two adjacent surfaces of the two insertion portions 121 of the connection unit 12 has a plurality of interference portions 122; a gap portion 112 is located at a side edge of the rod body 11; and a plurality of long troughs 113,113a,113b is located on a side surface and at least one adjacent side surface of the rod body 11.

The second frame 2 comprises a plurality of rod body 21 with a hollow portion 211, and a connection unit 22 in the hollow portions 211 of two adjacent rod bodies 21, where the connection unit 22 comprises two insertion portions 221 which are connected at a side and are inserted into the hollow portions 211 of the rod bodies 21; each of the two adjacent surfaces of two insertion portions 221 of the connection unit 22 has a plurality of interference portions 222; a gap portion 212 is located at a side edge of the rod body 21; and a plurality of long troughs 213,213a,213b is located on a side surface and at least one adjacent side surface of the rod body 21.

The support unit 3 comprises two side plates 31 connected at a side. The side plate 31 is fixed to the first and the second frames 1,2 at two ends coordinated with the fixing members 32 fixed to the long troughs 113a,213a of the corresponding rod bodies 11,21 so that the side plate 31 is fixed at the place the two rod bodies 11,21 are connected. Thus, a novel solar energy base-body structure is obtained.

Figure 3:
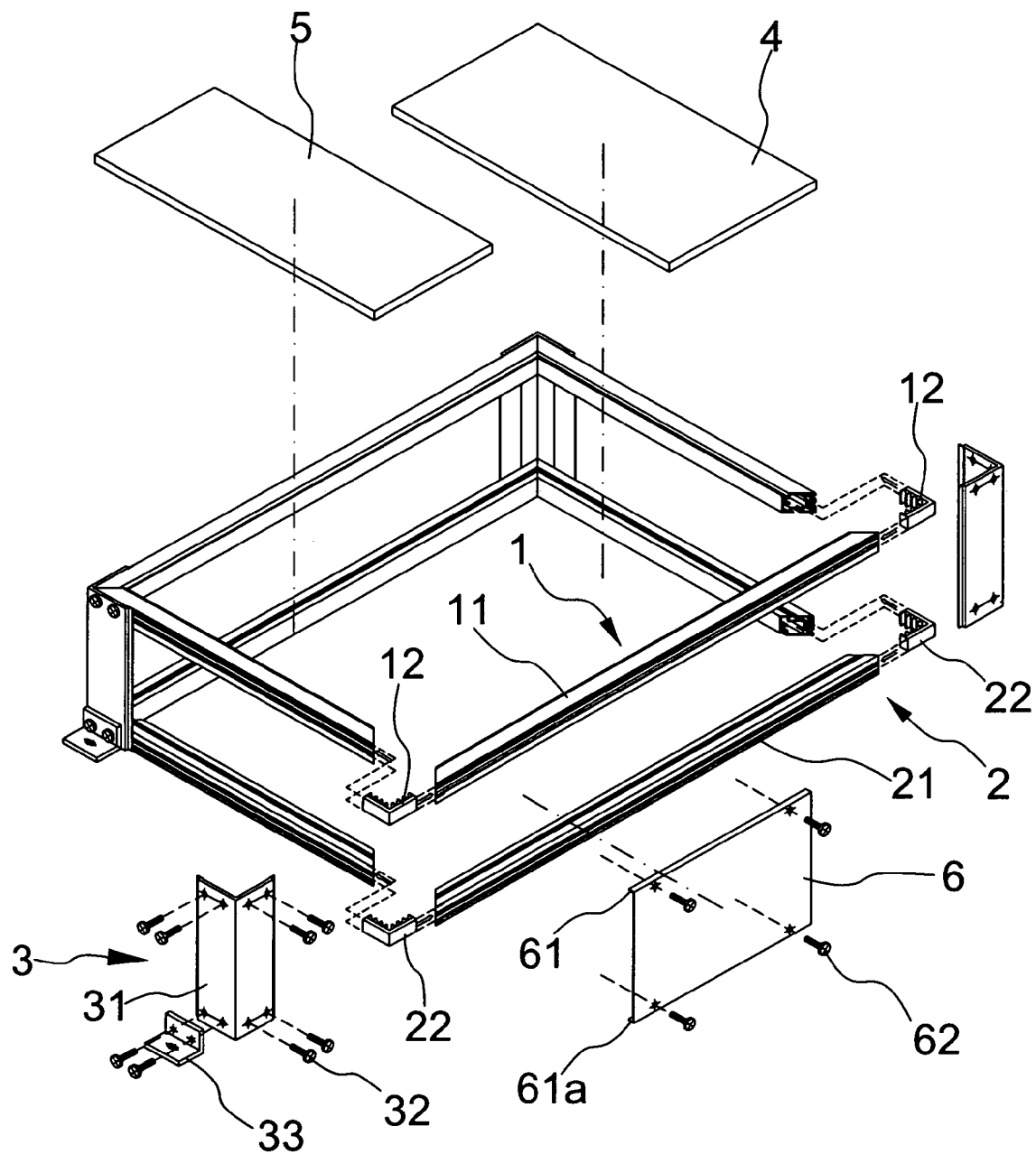
FIG. 3 is a view showing an assembling of a state of use.
Figure 4:
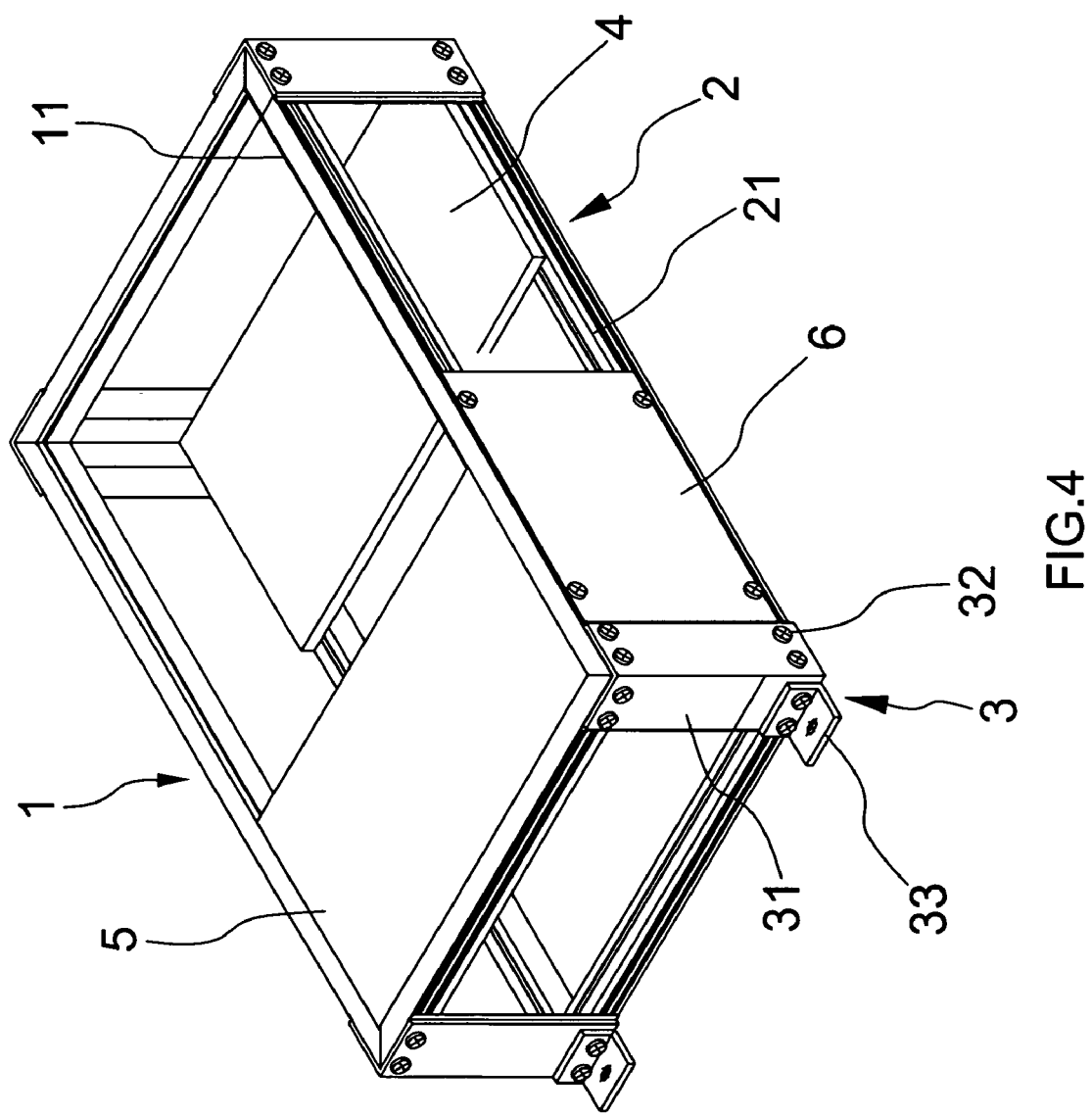
FIG. 4 is a view showing the state of use.
Figure 5:
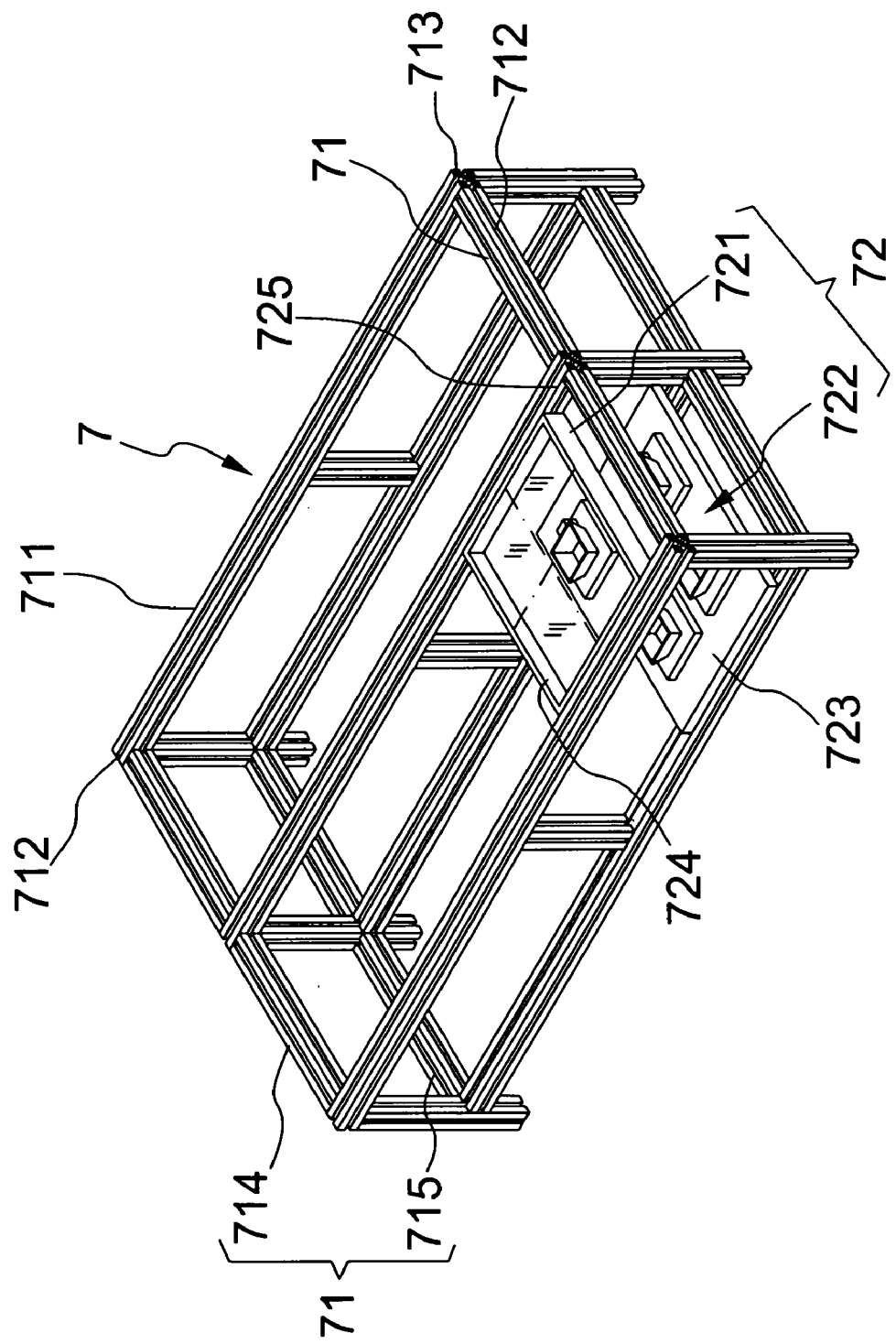
FIG. 5 is an explosive view of the prior art.
Figure 6:
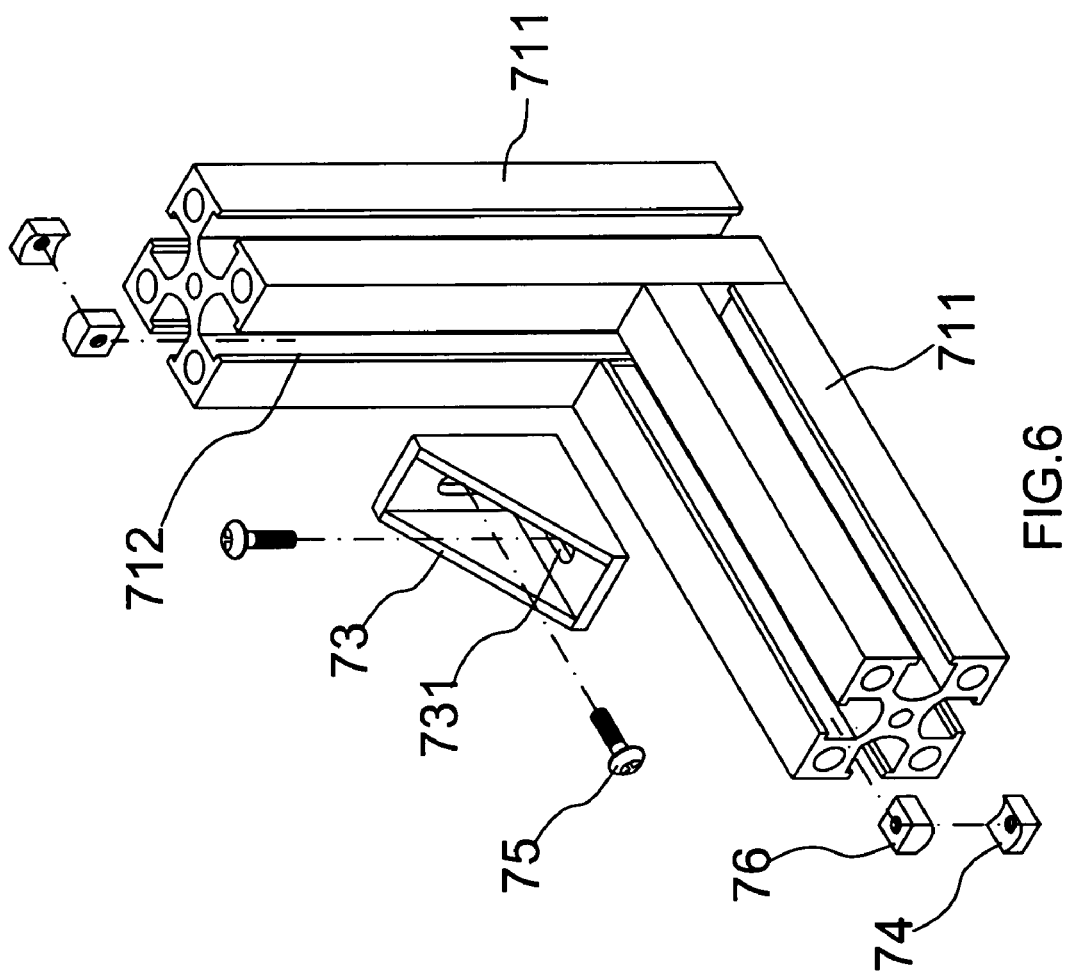
FIG. 6 and FIG. 7 are views of assembling the carrying frame of the prior art.
Figure 7:
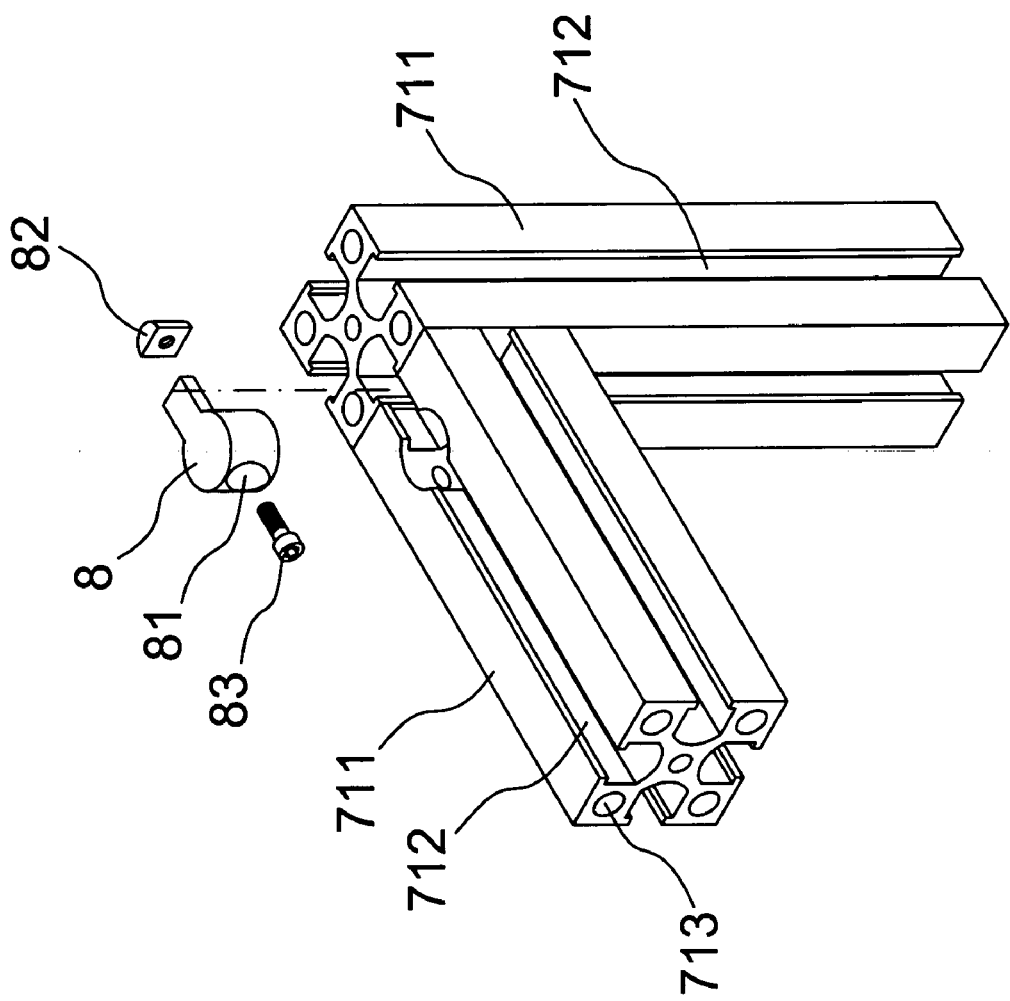

Please refer to FIG. 3 and FIG. 4, which are a view showing an assembling of a state of use and a view showing the state of use. As shown in the figure when assembling the present invention, at least four rod bodies 11 and at least four connection units 12 are obtained. The insertion portions 122 of the connection units 12 are inserted into the hollow portions 111 of the rod bodies 11 from two ends, where the two insertion portions 121 are interfered with the inner walls of the hollow portions 111 by the insertion portions 121 to be firmly inserted in the rod bodies 11. Thus, a first frame 1 is formed.

Then at least four other rod bodies 21 and at least four other connection units 22 are obtained. The insertion portions 222 of the connection units 22 are inserted into the hollow portions 211 of the rod bodies 21 from two ends, where the two insertion portions 221 are interfered with the inner walls of the hollow portions 111 by the insertion portions 221 to be firmly inserted in the rod bodies 21. Thus, a second frame 2 is formed.

After the first and the second frames 1,2 are formed, four support units 3 are obtained to be fixed at the four corners of the first and the second frames 1,2. Two ends of the side plate 31 are fixed to the long troughs 113a,213a of the rod bodies 11,12 coordinated with the fixing members 32 so that the support units 3 are fixed between the first and the second frames 1,2 and are positioned at the places two adjacent rod bodies 11,21 are connected. A solar cell seat 4 is fixed to the long troughs 213b of the rod bodies 21 of the second frame 2. A lens 5 is set across on corresponding gap portions 112 located at inner side edges of the rod bodies 11 of the first frame 1. At last, a cap plate 6 is fixed a cross the first and the second frames 1,2. The cap plate 6 is slightly bent at the edge to obtain an 'n' shape to set the extension portions 61,61a of the cap plate 6 in the long troughs 113,213 of the rod bodies 11,21. And the cap plate 6 is fixed to another long troughs 113a,213a of the rod bodies 11,21 coordinated with fixing members 62. Thus, the cap plate 6 is fixed on side surface between the first and the second frames 1,2. And a fixing plate 33 can be further fixed on at least one outside surface of the support unit 3 to stably set the solar energy base body at a required place.

To sum up, the present invention is a solar energy base-body structure, where a first frame and a second frame are formed with rod bodies coordinated with connection units; support units are used to fix the first frame and the second frame; and thus, the working process is simplified for fast assembling and cost and weight are reduced.

The preferred embodiment herein disclosed is not intended to unnecessarily limit the scope of the invention. Therefore, simple modifications or variations belonging to the equivalent of the scope of the claims and the instruction disclosed herein for a patent are all within the scope of the present invention.

What is claimed is:

1. A solar energy base-body structure, comprising:
   (A) a first frame, said first frame comprising
      a plurality of rod bodies, each said rod body having a hollow portion;
      a gap portion extending along a length of said rod body; and
      a plurality of long troughs extending along a length of said rod body; and
      a plurality of connection units;
   (B) a second frame, said second frame comprising
      a plurality of rod bodies, each said rod body having a hollow portion;
      a gap portion extending along a length of said rod body; and
      a plurality of long troughs extending along a length of said rod body; and
      a plurality of connection units; and
   (C) a plurality of support units, each said support unit comprising
      two side plates, each said side plate having a plurality of fixing members,
      wherein each said gap portion is located at a side edge of its respective rod body;
      wherein a plurality of the long troughs is disposed on a first side surface of said rod body and at least one long trough is disposed on a second side, surface abutting said first side surface of said rod body;
      wherein said connection unit is configured to be located entirely within two said hollow portions of two adjacent said rod bodies;
      wherein said side plates are connected with each other at a side, said side plate has two fixing members at each of two opposite ends of said side plate, and said side plate is fixed to a first said side long trough of said rod bodies coordinated with said fixing members; and
      wherein said support unit is fixed at a place two adjacent said rod bodies connected.

2. The structure according to claim 1, wherein said gap portion is located at inner side edge of said rod body; and
   wherein a lens is set across on said corresponding gap portions.

3. The structure according to claim 1, wherein a solar cell seat is fixed on said adjacent long trough of said rod body of said second frame.

4. The structure according to claim 1, wherein a cap plate is set in second side long troughs of the rod bodies and fixed between said first side long trough of said rod body of said first frame and said first side long trough of a corresponding said rod body of said second frame; and
   wherein said cap plate is set at a side of said support unit separately.

5. The structure according to claim 1, wherein said connection unit comprises two insertion portions connected with each other at a side; and
   wherein two adjacent surfaces of two said insertion portions of said connection unit have a plurality of interference portions on each surface, said interference portions on each adjacent surface being formed as a series of parallel plates perpendicularly extending from each of said two adjacent surfaces.

6. The structure according to claim 1, wherein said connection unit has an 'L' shape.

7. The structure according to claim 1, wherein a fixing plate is fixed on at least one outside surface of said support unit.

8. A solar energy base-body structure, comprising:
   (A) a plurality of rod bodies, each said rod body having a hollow portion;
      a gap portion extending along a length of said rod body; and
      a plurality of long troughs arranged on a first side surface and at least one long trough arranged on a surface abutting of the rod body, the long troughs extending along a length of the rod body;

(B) a plurality of connection units, said connection unit comprising two insertion portions; and (C) a plurality of support units, each said support unit comprising two side plates, each said side plate having a plurality of fixing members, wherein said gap portion is located at a side edge of said rod body;

wherein said hollow portion is penetrated through middle of said rod body;

wherein said two insertion portions of said connection unit are inserted into said hollow portions of two adjacent said rod bodies separately, the entire connection unit being configured to be located within said hollow portions of said two adjacent rod bodies;

wherein said two side plates of said support unit are connected with each other at a side, said side plate has two fixing members at each of two opposite ends of said side plate, and said side plate is fixed to first said side long troughs of said rod body coordinated with said fixing members; and wherein said fixing member is fixed at a place two adjacent said rod bodies are connected.

9. The structure according to claim 8, wherein each of two adjacent surfaces of two said insertion portions of said connection unit has a plurality of interference portions, said interference portions on each adjacent surface being formed as a series of parallel plates perpendicularly extending from each of said two adjacent surfaces.

10. The structure according to claim 8, wherein said connection unit has an 'L' shape.

11. The structure according to claim 8, wherein at least an outside surface of said support unit is fixed with a fixing plate.

12. The structure according to claim 8, wherein a cap plate is set in second side long troughs and fixed between two first side long troughs of two opposite rod bodies coordinated with said fixing members; and wherein said cap plate is set at a side of said support unit.

* * * * *